United States Patent [19]

Choi

[11] Patent Number: 5,080,310

[45] Date of Patent: Jan. 14, 1992

[54] OPTION BOARD HOLDER FOR USE IN A COMPUTER

[75] Inventor: Ho Choi, Seoul, Rep. of Korea

[73] Assignee: Hyundai Electronics Ind., Co., Ltd., Kyonggi-do, Rep. of Korea

[21] Appl. No.: 598,159

[22] Filed: Oct. 16, 1990

[30] Foreign Application Priority Data

Oct. 16, 1989 [KR] Rep. of Korea .............. 89-15035[U]

[51] Int. Cl.$^5$ .............................................. F16B 5/00
[52] U.S. Cl. ................................... 248/221.3; 211/41; 248/224.4; 248/225.2
[58] Field of Search ............... 248/224.4, 225.1, 225.2, 248/221.3, 222.1, 903; 211/41, 191, 192

[56] References Cited

U.S. PATENT DOCUMENTS

| | | | |
|---|---|---|---|
| 3,402,907 | 9/1968 | Fisher | 248/221.3 |
| 3,563,391 | 2/1971 | Weltha | 211/41 |
| 3,878,438 | 4/1975 | Weisman | 211/41 X |
| 3,901,611 | 8/1975 | Simonsen | 211/191 X |
| 4,022,326 | 5/1977 | Marconi | 211/41 |
| 4,032,096 | 6/1977 | Perrault et al. | 248/903 X |
| 4,157,228 | 6/1979 | Hammerschlag | 211/192 X |
| 4,222,542 | 9/1980 | Wilson et al. | 248/221.3 X |
| 4,327,835 | 5/1982 | Leger | 211/41 |
| 4,619,428 | 10/1986 | Bailey | 248/222.1 X |

FOREIGN PATENT DOCUMENTS

| | | |
|---|---|---|
| 60-15694 | 2/1985 | Japan . |
| 60-104927 | 7/1985 | Japan . |
| 60-184130 | 12/1985 | Japan . |
| 60-66325 | 4/1987 | Japan . |

Primary Examiner—David L. Talbott
Attorney, Agent, or Firm—Burns, Doane, Swecker & Mathis

[57] ABSTRACT

An option board holding apparatus for accomodating a plurality of option boards, e.g., memory boards or various ROM boards to be plugged in the expansion slots in a computer system to extend the computer's capability. The option board holding apparatus comprises a front chassis of a computer and a holding plate which is fitted into the front chassis. The front chassis has pairs of slots and the holding plate has mating pairs of latching means to be slidably received and retained in the slots. On the face of the holding plate opposite to the latching means is provided a plurality of rails defining channeled grooves for receiving one side edges of the option boards.

7 Claims, 3 Drawing Sheets

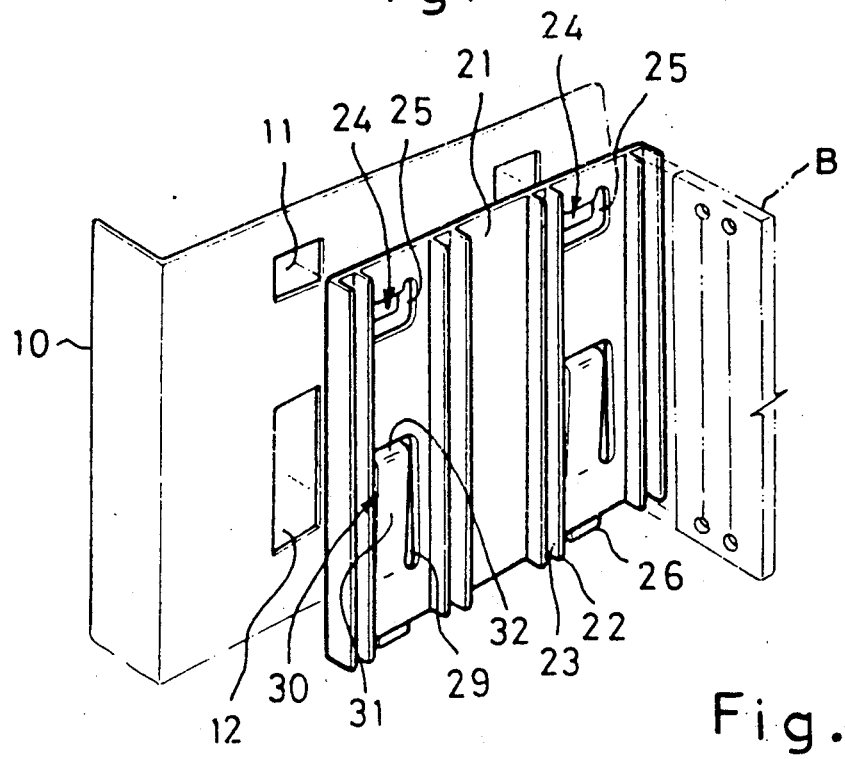
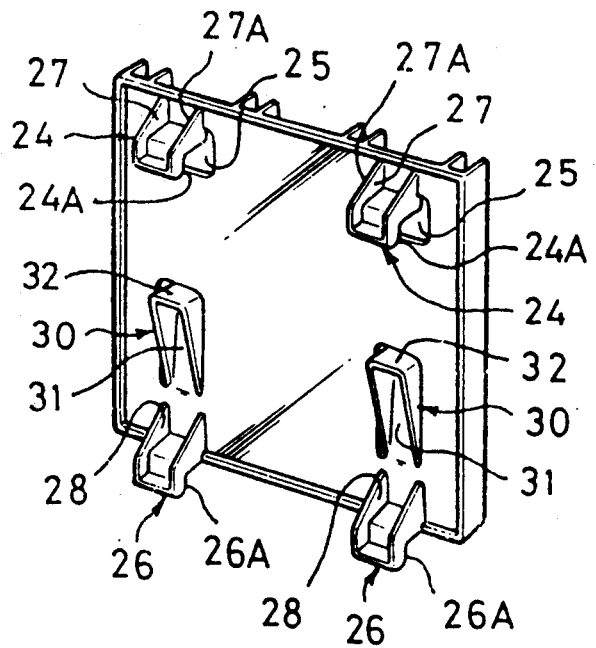

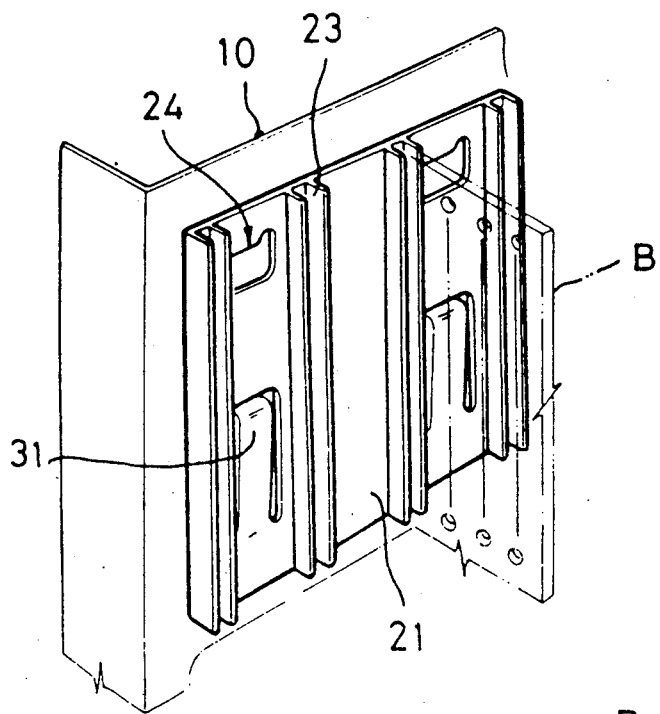
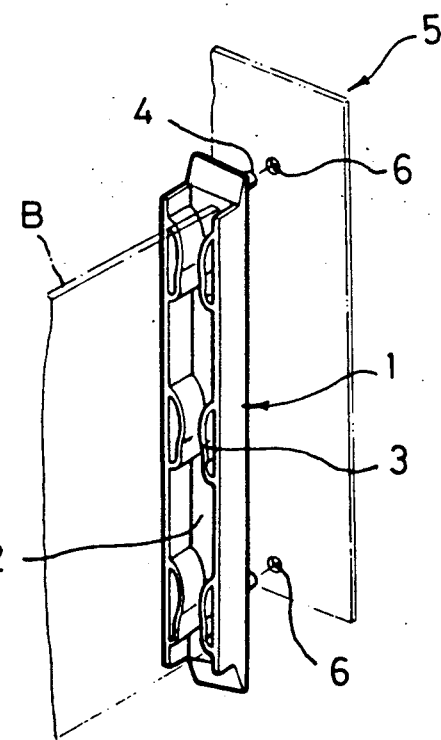
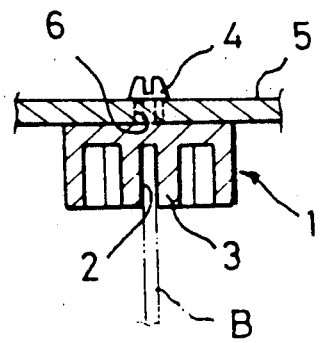

OPTION BOARD HOLDER FOR USE IN A COMPUTER

BACKGROUND OF THE INVENTION

This invention relates to a holding apparatus and more particularly to a holder for supporting option boards e.g., memory boards or ROM boards which are plugged in the expansion slots to extend computer's capability.

There are various kinds of option boards such as graphic boards, drive controller boards, boards for serial port and mouse or game port which can be plugged in the expansion slot in a computer system to extend the computer's capability.

Of the option boards the board for serial port, mouse or game port is comparatively light in weight and of substantially the same width as the computer's main body. Accordingly, no serious problems are raised when only the rear end of the board is fixed to the rear surface of the computer with the front end remaining free. However, such option boards as memory boards or various ROM function boards are generally heavy and long, thereby, by stabilizing it only at the rear end the structure form becomes deformed or it is bent by the shock caused during conveyance or by the generated heat during operation. Besides, there is a high likelihood that such boards would be determined as inferior goods in the drop test.

Accordingly, the heavy and long option boards have been used with the same numbered holders that accommodates the boards in such a way that they can individually be inserted or removed. The holding apparatus has been constructed to have aproximately the same length as the length between the front and rear ends of the computer and to have the front end fixed to the front chassis of the computer's main body.

As shown in FIGS. 5 and 6, the prior art board holder 1 consists of a channel upright 1. In the vertically channeled portion 2 are pairs of inwardly protruding opposite contact spring members 3. The vertical edge of one side of the option board B is resiliently and demountably inserted in the vertical passage defined by the pairs of the opposite contact spring members 3. The fitting of the board holder 1 to a front chassis 5 is accomplished by press fitting a plurality of cylindrical spring protrusions 4 into matching apertures 6. As shown in FIG. 5, the spring protrusions 4 are provided on the rear surface of the board holder 1. The matching aligned apertures 6 are located on the front chassis.

The individual injection molding of the prior art board holder tends to prevent the finished holder from forming the correct structure. Therefore, an undesirable opening is formed between the front chassis 5 and the rear surface of the channel upright 1, which will prevent the exact fitting of the upright 1 in the front chassis 5.

Granting that the channel upright 1 is fitted to the front chassis 5, the fit is achieved loosely which will cause damage to the board holder 1 during conveyance or drop test because of shock.

In addition, the process of fitting the plurality of individual board holders to the front chassis is cumbersome, thus increasing the labor force and time. Furthermore, the injection molding is complicated, thus increasing the manufacture cost.

In another prior art board holder, the fastening of the board holder to the front chassis is accomplished by heating protrusions which have been received in matching apertures.

SUMMARY OF THE INVENTION

One object of the present invention is to provide an integrally formed holding apparatus for carrying a plurality of individual option boards.

Another object of the present invention is to provide an integrally formed holding apparatus which is not deformed through injection molding.

Another object of the present invention is to provide an integrally formed holding apparatus in which the molding process by injection is simple and therefore inexpensive to manufacture.

The above objects of the present invention are achieved in the option board holding apparatus of the present invention which includes a channeled holding plate and a front chassis of a computer in which the holding plate is fitted. The front chassis has pairs of upper and lower slots for slidably receiving mating latch means which are integrally molded with the board holding plate. The board holding plate has integrally molded therewith a plurality of vertical rail portions for slidably receiving and retaining vertical edges of one side of the option boards therein. The latch means comprises two pairs of upper and lower downturned depending resilient protrusions and a pair of middle elongated cantilever spring portions. Each latch means has integrally molded therewith resilient edges for assuring that the board holder is properly engaged to the front chassis.

The objects and features of the present invention are set forth with particularity in the appended claims. The present invention may be best understood by reference to the following description, taken in connection with the accompanying drawings in which like numerals indicate like parts.

BRIEF DESCRIPTION OF THE DRAWINGS

FIG. 1 is an exploded perspective view of the front chassis and ROM board holder;

FIG. 2 is a rear perspective view of the ROM board holder of the present invention;

FIG. 3-B shows the assembly of the components shown in FIG. 1 in cross-section;

FIG. 4 is a perspective view of the assembly of the componenents shown in FIG. 1;

FIG. 5 is an exploded perspective view of the prior art ROM board holder and front chassis;

FIG. 6 shows the assembly of the components shown in FIG. 5 in cross-section.

DETAILED DESCRIPTION OF THE INVENTION

Figure 3A:
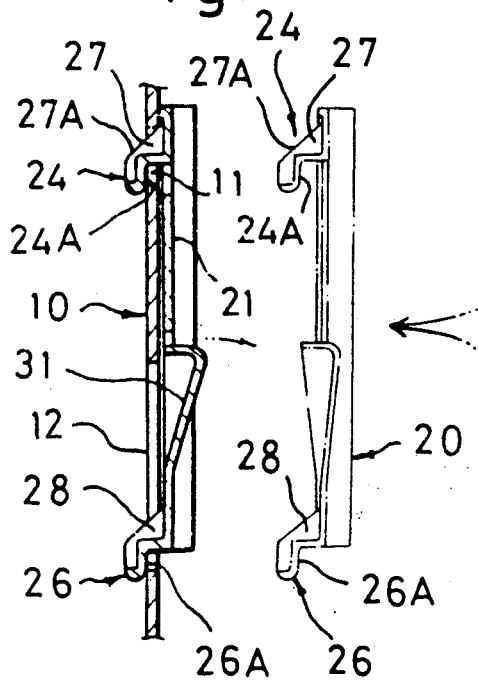
FIG. 3-A shows the components shown in FIG. 1 ready for assembly thereof in cross-section.

Referring to the drawings, a front chassis 10 includes substantially square upper slots 11 spaced parallel to one another. Directly below each square upper slot 11 there is a substantially elongated lower slot 12. As is readily apparent from the ensuing description, the slots 11 and 12 for engaging a board holder member 20 are shown in FIGS. 1–4.

Referring now particularly to FIGS. 1 and 2, the construction of the board holder member 20 is disclosed. The board holder member 20 comprises a vertical plate 21. The vertical plate 21 has vertical rail portions 22. Each vertical rail portion 22 defines a vertical recess 23 to act as a guiding groove for removable attachment of the vertical edges of the board B.

It is noted that the number of the rail portions 22 varies by the kinds of the computers.

As is best shown in FIG. 2, the board holder member 20 incorporates upper openings 25 with each upper opening 25 directly in front of each mating square upper slots 11. In front of each upper opening 25 there is an upper downturned depending resilient protrusion 24 to be slidably received and retained in the mating square upper slot 11 in the assembled structure.

The upper downturned depending resilient protrusion 24 extends from the vertical plate 21 in a direction opposite to the direction of rail portions 22 and includes reinforcing sides 27 having beveled sections 27A to facilitate the insertion into square upper slot 11 and to prevent the damage that might be caused by the force upon the upper downturned depending resilient protrusion 24 during assembly or disassembly. Resilient lower end 24A is incorporated in the depending resilient protrusion 24 to provide resilient engaging means with with the front chassis 10 and displaced below the lower edge of upper square slot 11 in the assembled structure.

Directly below each upper downturned depending resilient protrusion 24 is a vertical cantilever spring portion 30 having a peripheral slit 29. Vertical cantilever spring portion 30 includes an elongated section 31 and a resilient arm 32 which is bent toward the opposite direction of the rail protrusions 22 to bias cantilever sping portion 30 upwardly into contact with the upper periphery of the elongated lower slot 12.

Lower downturned depending resilient protrusions 26 are provided on opposite portions of the first downturned depending resilient protrusions 24. Each downturned depending resilient protrusion 26 is displaced below the mating vertical cantilever spring portion 30 and includes reinforcing sides 28 to prevent damage that might be caused by the force upon the second downturned depending resilient protrusion 26 during assembly or disassembly.

Figure 3B:
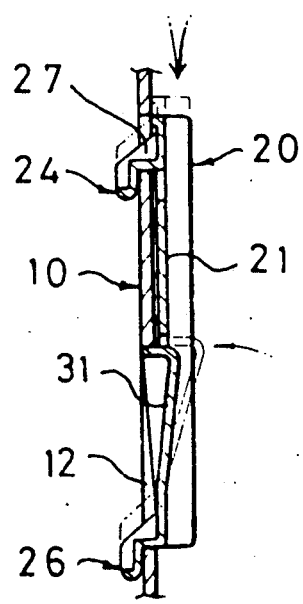

With reference to FIG. 3, the assembly of the front chassis 10 and the board holder 20 of the present invention will now be discussed. The front chassis 10 and the board holder 20 are displaced so that the beveled sections of the upper and lower downturned depending portions 24 and 26 have the same or higher as or than the lower periphery of the square and elongated slots 11 and 12.

After the first and second downturned depending resilient protrusions 24 and 26 have been positioned as described, the board holder 20 is directed toward the front chassis 10 which will slide the the board holder 20 downwardly due to the cam function between beveled sections 27A and upper periphery of the upper square slots 11. In this state, the resilient lower ends 24A, 26A are in slightly separated positions from the lower periphery of the square and elongated slots 11 and 12, while the resilient arms 32 are in rearward tilt position by bouncing over the front chassis 10 at the leading edges thereof as indicated by dotted lines in FIG. 3-B.

Thereafter, any downward force on the board holder 20 causes a close fit of the first and second resilient lower ends 24A and 26A into the lower periphery of the square and elongated slots 11 and 12, thus preventing the movement of the board holder 20 with respect to the front chassis 10. The vertical edges of the option boards B are then inserted into the mating vertical recesses 23.

The disengagement of the board holder 20 from the front chassis 10 is achieved in a reverse manner by simply pushing the resilient arms 32.

While in accordance with the provisions and statutes, there has been illustrated and described the best form of the invention, certain changes may be made without departing from the spirit of the invention as set forth in the appended claims and in some cases, certain features of the invention may be used to advantage without a corresponding use of other features.

What is claimed is:

1. An option board holding apparatus for use in a computer to accommodate a plurality of option boards which can be plugged into expansion slots to extend the computer's capability, said computer having a front chassis, said front chassis having an upper slot and a lower slot, said option board holding means comprising:
   an option board holding plate;
   a plurality of pairs of rail portions provided on the rear surface of said holding plate, each pair of said rails defining a channeled groove for slidably receiving and retaining one side vertical edge of an option board;
   upper downturned depending resilient latch means extending from said board holding plate in the direction opposite to the direction of said rail portions, said upper latch means having beveled reinforcing side sections for being slidably received in the upper slot;
   lower downturned depending resilient latch means extending from said board holding plate in the direction opposite to the direction of said rail portions, said lower latch means having beveled reinforcing side sections for being slidably received in the lower slot; and
   elongated resilient middle latch means provided on said holding plate for engaging the lower slot, the uppermost edge thereof for abutting against a corresponding upper periphery of said lower slot.

2. An option board holding apparatus according to claim 1, wherein said upper resilient latch means have cantilevered slits provided on the periphery thereof.

3. An option board holding apparatus according to claim 1, wherein each of said reinforcing sides of said upper and lower downturned depending resilient latch means has a beveled section for slidingly contacting with said slots.

4. An option board holding apparatus according to claim 1, wherein said elongated resilient middle latch means is cantilevered by slits provided on the periphery thereof.

5. An option board holding apparatus according to claim 4, wherein said uppermost free edge is extended from said front chassis in the opposite direction to said rail portions.

6. An option board holding apparatus according to claim 1, wherein each of said reinforcing sides of said upper and lower downturned depending resilient latch means has a beveled section for sliding contacting with said slots.

7. An option board holding apparatus for use in a computer to accommodate a plurality of option boards which can be plugged into expansion slots to extend the computer's capability, said computer having a front chassis, said front chassis having pairs of upper and lower slots, said option board holding means comprising:

an option board holding plate:

a plurality of pairs of rail portions provided on the rear surface of said holding plate, each pair of said rails defining a channeled groove for slidably receiving and retaining one side vertical edge of an option board;

upper hooks, each upper hook formed from a square flap punched out from an upper part of said holding plate and comprises of a first portion connected to said plate and extending rearward therefrom and a second hook portion extending from said first portion substantially parallel to said plate for engaging with a lower periphery of a corresponding one of said upper slots, said first portion having at least a pair of slanted reinforcing side ribs extending parallel to each other;

lower hooks extending rearward from the lower end of said holding plate, each lower hook having a first portion connected to said holding plate and a second hook portion extending from the first portion for engaging with the lower periphery of a corresponding one of said lower slots, said first portion having a pair of slanted reinforcing side ribs extending parallel to each other; and elongated resilient latch means having upper resilient faces provided on said holding plate for engaging with a corresponding one of said lower slots with the upper resilient faces thereof abutting against corresponding upper peripheries of said lower slots.

* * * * *